United States Patent [19]
Huang et al.

[11] Patent Number: 5,929,474
[45] Date of Patent: Jul. 27, 1999

[54] ACTIVE MATRIX OED ARRAY

[75] Inventors: Rong-Ting Huang, Gilbert; Hsing-Chung Lee, Calabasas; Song Q. Shi, Phoenix, all of Ariz.

[73] Assignee: Motorola, Inc., Schaumburg, Ill.

[21] Appl. No.: 08/814,136

[22] Filed: Mar. 10, 1997

[51] Int. Cl.$^6$ ................................................. H01L 33/00
[52] U.S. Cl. .......................... 257/292; 257/79; 257/80; 257/81; 257/82; 257/83; 257/88; 257/114; 257/116; 257/222; 257/233; 257/257; 257/258; 257/290; 257/291; 257/292; 257/293; 250/370
[58] Field of Search ................................ 257/79–88, 222, 257/233, 257, 258, 290–292, 293, 114, 116; 313/104, 425, 500, 505, 506, 781; 250/370

[56] References Cited

U.S. PATENT DOCUMENTS

| | | | |
|---|---|---|---|
| 5,434,433 | 7/1995 | Takasu et al. | 257/59 |
| 5,475,262 | 12/1995 | Wang et al. | 257/523 |
| 5,604,360 | 2/1997 | Zhang et al. | 257/59 |

*Primary Examiner*—Fetsum Abraham
*Attorney, Agent, or Firm*—Eugene A. Parsons; William E. Koch

[57] ABSTRACT

An active matrix OED array includes an array area defined on a semiconductor substrate defining rows and columns of pixels and driver areas spaced from the array area with driver circuits including row drivers coupled to row buses and column drivers coupled to column buses formed in the driver areas. An active control circuit and an OED are formed in each pixel of the array area and coupled to a row and a column bus adjacent each pixel. A second substrate is formed of light transmissive material and includes externally accessible electrical connectors coupled to the driver circuits. The semiconductor substrate includes a first bump pad encircling the array area and the second substrate includes a mating second bump pad with the first and second bump pads engaged to seal the array area.

22 Claims, 3 Drawing Sheets

ACTIVE MATRIX OED ARRAY

FIELD OF THE INVENTION

The present invention pertains to matrices of organic light emitting devices and more specifically to active matrices and methods of fabrication.

BACKGROUND OF THE INVENTION

Displays utilizing two dimensional arrays, or matrices, of pixels each containing one or more light emitting devices are very popular in the electronic field and especially in portable electronic and communication devices, because large amounts of data and pictures can be transmitted very rapidly and to virtually any location.

Light emitting diode (LED) arrays are becoming more popular as an image source in both direct view and virtual image displays. One reason for this is the fact that LEDs are capable of generating relatively high amounts of light (high luminance), which means that displays incorporating LED arrays can be used in a greater variety of ambient conditions. For example, reflective LCDs can only be used in high ambient light conditions because they derive their light from the ambient light, i.e. the ambient light is reflected by the LCDs. Some transflective LCDs are designed to operate in a transmissive mode and incorporate a backlighting arrangement for use when ambient light is insufficient. In addition, transflective displays have a certain visual aspect and some users prefer a bright emissive display. However, these types of displays are generally too large for practical use in very small devices.

Also, organic light emitting diodes or organic electroluminescent devices (OLED or OED, hereinafter OED) and arrays thereof are emerging as a potentially viable design choice for use in small products, especially small portable electronic devices, such as pagers, cellular and portable telephones, two-way radios, data banks, etc. OED arrays are capable of generating sufficient light for use in displays under a variety of ambient light conditions (from little or no ambient light to bright ambient light). Further, OEDs can be fabricated relatively cheaply and in a variety of sizes from very small (less than a tenth millimeter in diameter) to relatively large (greater than an inch) so that OED arrays can be fabricated in a variety of sizes. Also, OEDs have the added advantage that their emissive operation provides a very wide viewing angle.

Generally, OEDs include a first electrically conductive layer (or first contact), an electron transporting and emission layer, a hole transporting layer and a second electrically conductive layer (or second contact). Generally, the various layers must be positioned on a planar surface at least defining the extent of the OED. The light can be transmitted either way but must exit through one of the conductive layers. There are many ways to modify one of the conductive layers for the emission of light therethrough but it has been found generally that the most efficient LED includes one conductive layer which is transparent to the light being emitted. Also, one of the most widely used conductive, transparent materials is indium-tin-oxide (ITO), which is generally deposited in a layer on a transparent substrate such as a glass plate.

A major problem with OEDs utilizing a conductive, transparent layer is the high resistivity of the conductive transparent material. ITO, for example, has a resistivity of approximately 50 ohms/square. Further exacerbating this problem is the fact that OEDs are current driven devices (i.e. emit due to current flowing through them), as opposed to voltage driven devices, such as LCDs. Thus, the high resistivity contact of the OED becomes virtually prohibitive when attempting to place OEDs in large arrays.

Another problem complicating the fabrication of OED arrays is the fact that the various layers of each OED must be deposited on a planar surface, thus, complicating the integration of an active network into the array. If an active circuit for each pixel of the array is positioned adjacent and to one side of each pixel, for example, the fill factor (the ratio of luminescent area to non luminescent area) for the array will be so poor it will produce unsatisfactory images.

Accordingly, it would be beneficial to provide an active OED array and driving apparatus which overcomes these problems.

It is a purpose of the present invention to provide a new and improved active OED array and driving apparatus.

It is another purpose of the present invention to provide a new and improved active OED array and driving apparatus with a high fill factor.

It is still another purpose of the present invention to provide a new and improved active OED array and driving apparatus which is easier and less expensive to fabricate and use.

It is a further purpose of the present invention to provide a new and improved active OED array and driving apparatus in which the OED, active circuits and drivers are integrated onto a single substrate.

It is a still further purpose of the present invention to provide a new and improved active OED array and driving apparatus in which the OED, active circuits and drivers are integrated onto a single substrate and passivated to improve reliability.

SUMMARY OF THE INVENTION

The above problems and others are at least partially solved and the above purposes and others are realized in an active matrix OED array including an array area defined on a semiconductor substrate defining rows and columns of pixels and driver areas spaced from the array area with driver circuits including row drivers coupled to row buses and column drivers coupled to column buses formed in the driver areas. An active control circuit and an OED are formed in each pixel of the array area and coupled to a row and a column bus adjacent each pixel.

In a specific example, the active matrix OED array includes a semiconductor substrate having an array area defined thereon. A plurality of field effect transistors, each including first and second current carrying terminals and a control terminal, are formed in the array area on the semiconductor substrate in rows and columns. Each of the rows includes a row bus coupled to the first current carrying terminal of each field effect transistor in the row, and each of the columns includes a column bus coupled to the control terminal of each field effect transistor in the column. A planarizing layer of insulating material is positioned over the plurality of field effect transistors in the array area and defines a substantially planar surface. A plurality of contact pads is formed on the planar surface of the planarizing layer in the array area in rows and columns, one contact pad associated with each field effect transistor of the plurality of field effect transistors, and coupled to the second current carrying terminal of the associated field effect transistor. A plurality of layers of organic material are sequentially formed in overlying relationship on the contact pads in the array area so as to define an OED on each contact pad with each contact pad operating as a first terminal of an overlying OED, and an electrical and light conducting layer of material is positioned in overlying relationship over the layers of organic material in the array area and operate as a common second terminal of the OEDs.

In a more specific example, a second substrate is formed of light transmissive material and includes externally accessible electrical connectors coupled to the driver circuits. The semiconductor substrate includes a first bump pad encircling the array area and the second substrate includes a mating second bump pad with the first and second bump pads engaged to seal the array area.

BRIEF DESCRIPTION OF THE DRAWINGS

Referring to the drawings.

DESCRIPTION OF THE PREFERRED EMBODIMENTS

Figure 1:
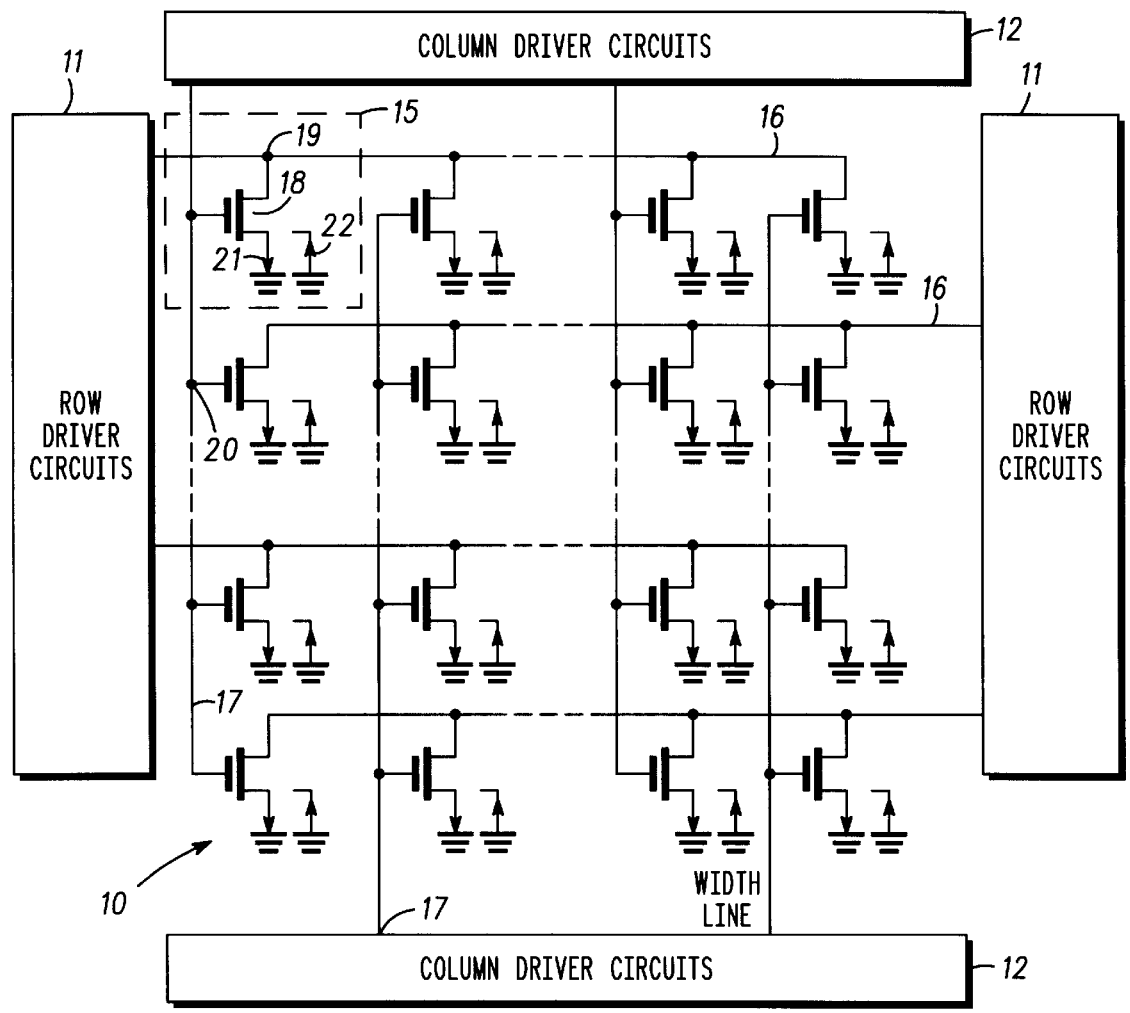
FIG. 1 is a simplified schematic diagram of an active matrix and driver circuits in accordance with the present invention.

Referring specifically to FIG. 1, a simplified schematic diagram is illustrated of an active matrix 10, row driver circuits 11 and column driver circuits 12 in accordance with the present invention. As will be seen presently, active matrix 10 and row and column driver circuits 11 and 12 are all formed on a single semiconductor substrate. Further, active matrix 10 is formed in an array area, which in this specific embodiment is positioned generally centrally, and row and column drivers 11 and 12 are positioned in driver areas, which in this specific embodiment are positioned around the perimeter of the array area. Also, row drivers 11 and column drivers 12 are each split into two groups positioned on opposite sides of the array area so that alternate row buses terminate on opposite sides of the array area to allow more area for each driver and, similarly, alternate column buses terminate on opposite sides of the array area.

Active matrix 10 includes a plurality of pixels 15 arranged in rows and columns with each row having an associated row bus 16 and each column having an associated column bus 17. Each pixel 15 of active matrix 10 includes a field effect transistor (FET) 18 having a first current carrying terminal 19 connected to the associated row bus 16 and a control terminal 20 connected to the associated column bus 17. The anode of an organic electroluminescent device (OED) 21 is connected to a second current carrying terminal of FET 18 and the cathode is connected to a common potential, such as ground. In a somewhat different embodiment (illustrated as a second OED 22 parallel with OED 21 but unconnected), second OED 22 has the anode connected to the second current carrying terminal of FET 18 and the cathode is connected to the common potential, such as ground. Both OEDs 21 and 22 will be explained in detail presently.

While the specific embodiment disclosed herein utilizes a single FET as a switch in series with each OED to produce an active array, it will be understood by those skilled in the art that additional components can be incorporated within the concepts of the present invention. Also, while n-type MOSFETs are incorporated as the active switch and CMOS drivers are used as row and column drivers in the preferred embodiment, it will be understood that other components and types can be substituted in accordance with the precepts of this invention.

Figure 2:
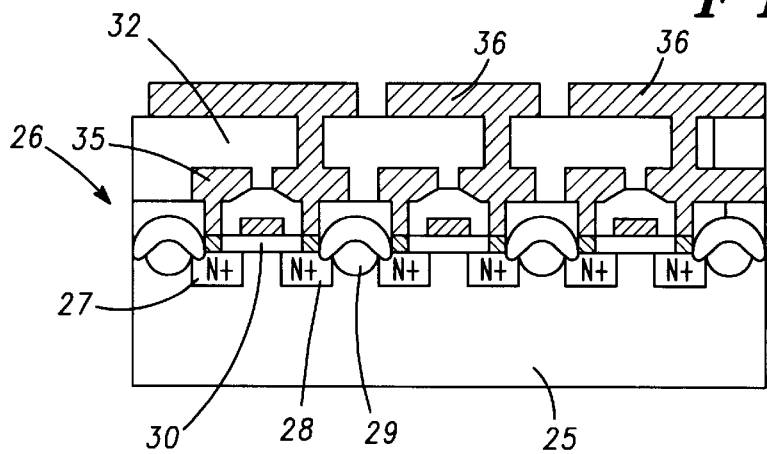
FIG. 2 is a simplified cross-sectional view of a portion of an active matrix illustrating an intermediate step in the fabrication of the active matrix.

Turning now to FIG. 2, a simplified cross-sectional view of a portion of active matrix 10 is illustrated, showing an intermediate step in the fabrication thereof. A semiconductor substrate 25 is provided having an array area and driver areas defined thereon. In this preferred embodiment substrate 25 is formed of p-doped silicon, but which may be any of the well known materials including silicon, gallium arsenide, silicon carbide, sapphire, etc. A plurality of field effect transistors (FETs, 3 of which are illustrated) are formed on substrate 25 using conventional semiconductor processing techniques, which processing techniques depend largely on the type of material used in substrate 25. It should be understood that FIG. 2 represents array 10 with the FETs being formed in the array area on semiconductor substrate 10 and in rows and columns. For convenience, a single FET 26 will be discussed.

FET 26 includes a drain terminal 27 and a source terminal 28, formed by doping areas of substrate 25 with N+ dopant in a conventional technique. A field oxide 29 surrounds FET 26 and isolates FET 26 from electrical communication with adjacent FETs. A layer of gate oxide 30 is formed on the surface of substrate 25 and openings are formed therethrough to communicate with drain terminal 27 and source terminal 28. A poly-silicon gate terminal 32 is formed on the surface of gate oxide 30 between drain terminal 27 and source terminal 28. While a MOSFET is illustrated in this preferred embodiment, it will be understood that other types of transistors or FETs can be utilized, if desired and convenient. Further, each gate terminal in each column of FETs is connected to a column bus 17, for example, gate terminal 32 extends into and out of FIG. 2 to form a column bus 17 that continues across the array area and into electrical communication with drivers in the driver areas.

Metal is deposited in the openings through gate oxide 30 and to form ohmic contacts with drain terminal 27 and source terminal 28. A thick layer of dielectric, in this example $SiO_2$, is formed over the entire array area and openings are again formed in correspondence with the metal contacting drain terminal 27 and source terminal 28. A metallization step is then performed to provide an electrical contact for each of drain terminal 27 and source terminal 28. At this time, all of the drain contacts in each row are connected together by a row bus formed during the metallization step. At this point a complete array of field effect transistors is formed on substrate 25 with the drain terminals connected in rows and the gate terminals connected in columns. It will of course be understood that drivers are normally fabricated, using conventional semiconductor processing techniques, during the fabrication of the array of field effect transistors. Further, because of the low power consumption and simplicity of manufacture, the driver circuits normally include CMOS VLSI driver circuits.

A planarizing layer 35 of insulating material, which in this specific example includes a layer of field silicon oxide (SiO$_2$), is positioned over the array of field effect transistors in the array area so as to define a substantially planar surface. Planarizing layer 35 can be deposited by any convenient process including, for example, a CMP process. Openings are formed through planarizing layer 35 in communication with the source contact of each FET in the array. A plurality of contact pads 36 are formed on the planar surface of planarizing layer 35 in the array area in rows and columns, one to define each pixel in the array. As will be understood presently, the size and shape of each contact pad 36 determines the size and shape of the light emitting area of each pixel in the array area. Also, the openings through planarizing layer 35 are filled to electrically connect each contact pad 36 with the source of the FET beneath each contact pad 36. In this embodiment contact pads 36 and the source connections are formed by depositing a layer of aluminum and patterning the layer to define the individual pads.

Figure 3:
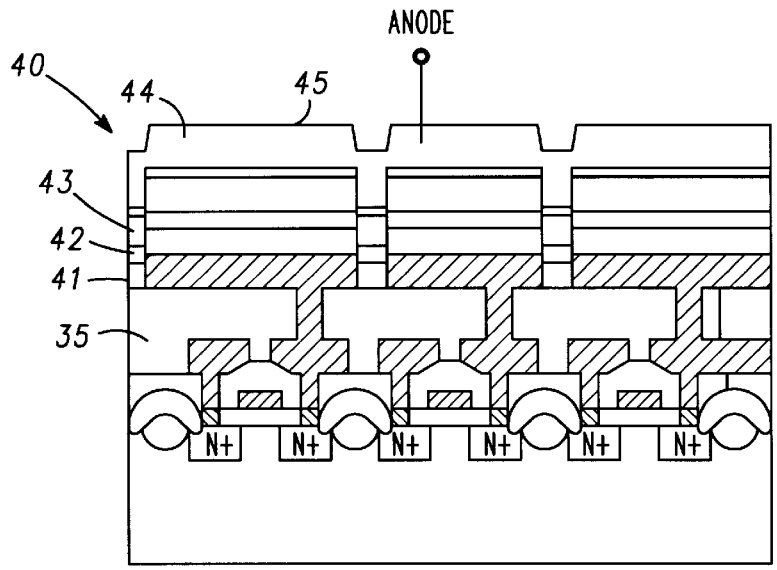
FIG. 3 is a simplified cross-sectional view, similar to FIG. 2, illustrating the complete active matrix.

Turning now to FIG. 3, a plurality of layers of organic material are sequentially formed in overlying relationship on contact pads 36 in the array area so as to define an organic light emitting device (OED) 40 on each contact pad 36 with each contact pad 36 operating as a first terminal of the overlying OED 40. In practice, the organic material is deposited in blanket films covering the entire array area, as illustrated in FIG. 3. Also, in this specific embodiment, the aluminum contact pads 36 operate as the cathode of the overlying OED 40 so that an electron transport layer 41 is deposited first, followed by a light emission layer 42, and a hole transporting layer 43. It will of course be understood that additional or fewer organic layers may be utilized, depending upon the specific type and application of the OED.

Electrical and light conducting material is positioned in overlying relationship on the surface of layer 43 in the array area to operate as a common second terminal of OEDs 40. In this specific example, the electrical and light conducting material includes a very thin layer 44 of gold with a thicker layer 45 of indium-tin-oxide. Layer 44 of gold is thin enough to conduct light therethrough and is included to improve the conductivity of layer 45, as well as to match the electrical characteristics of hole transporting layer 43. It should be understood that organic layers 41, 42 and 43 conduct current chiefly in the vertical direction, i.e. directly between contact pad 36 and layers 44 and 45 so that the light emission area of each OED 40 is defined substantially by the underlying contact pad 36.

Figure 4:
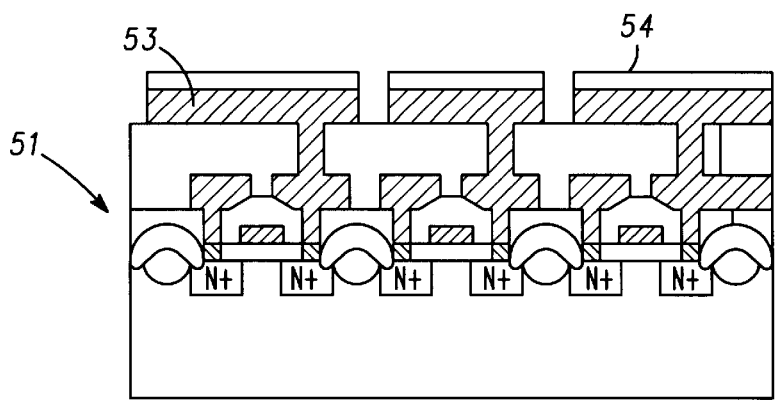
FIG. 4 is a view similar to FIG. 2, illustrating an intermediate step in the fabrication of another embodiment of the active matrix.
Figure 5:
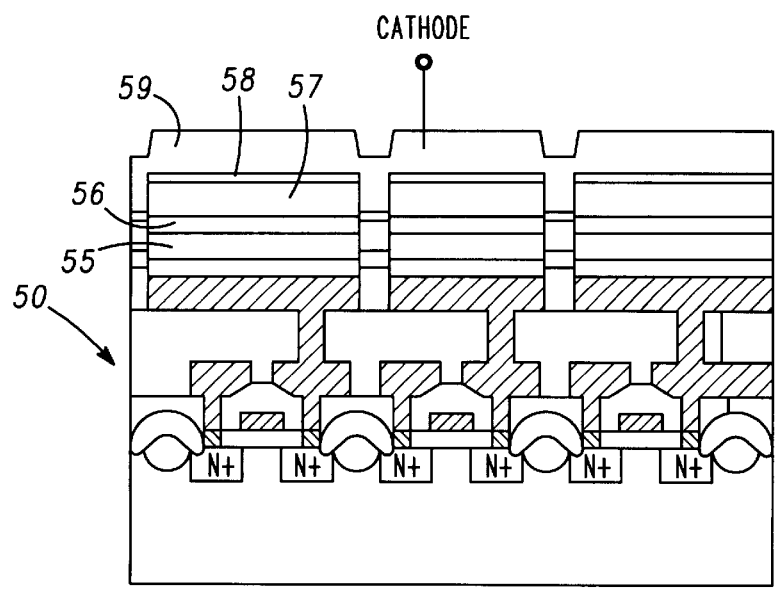
FIG. 5 is a view similar to FIG. 3 illustrating the complete embodiment shown in FIG. 4.

Referring now to FIGS. 4 and 5, another embodiment of an active matrix is illustrated in which a plurality of OEDs 50 are reversed in polarity. As illustrated in FIG. 4, an array of FETs 51, planarizing layer 52 and contact pads 53 are formed as previously described with reference to FIG. 2. Additionally, a layer 54 of indium-tin-oxide (ITO) is deposited on the surface of the metallization layer (prior to the formation of contact pads 53) and patterned to be coextensive with contact pads 53. Organic material is deposited in blanket films covering the entire array area, as illustrated in FIG. 5. In this specific embodiment, the ITO contact pads 54 operate as the anode of the overlying OED 50 so that a hole transport layer 55 is deposited first, followed by a light emission layer 56, and an electron transporting layer 57.

Electrical and light conducting material is positioned in overlying relationship on the surface of layer 57 in the array area to operate as a common second terminal of OEDs 50, in this specific example the cathode. The electrical and light conducting material includes a very thin layer 58 of a low work function material, such as magnesium or a lithium compound (e.g. Li—Ag), with a thicker layer 59 of indium-tin-oxide. Layer 58 of low work function material is thin enough to conduct light therethrough and is included to improve the conductivity of layer 59, as well as to match the electrical characteristics of electron transporting layer 57.

Figure 6:
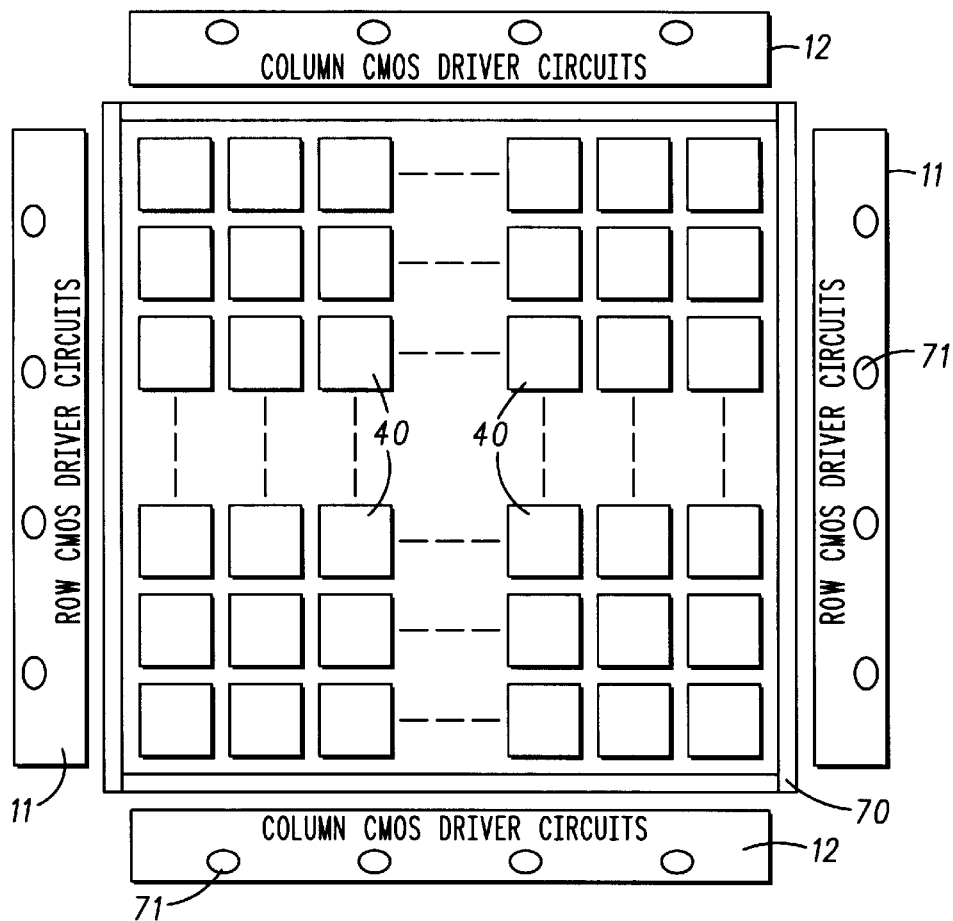
FIG. 6 is a view in top plan of the active matrix of FIGS. 3 or 5 and associated driver circuits on a single substrate.

Turning now to FIG. 6, a view in top plan is illustrated of active matrix 10 of FIG. 3 (or FIG. 5) and associated driver circuits integrated on a single substrate. Here it can be seen that each OED 40 is limited in area only by the size of the array area and the number of OEDs formed in that area. The fill factor of the array area is greatly improved because the space between adjacent pixels (OEDs 40) is only required to be large enough to prevent electrical contact between adjacent contact pads 36. Also, because of the novel construction, manufacture of active matrix structure 10 is greatly simplified. Further, because no etching and other potentially defect and/or impurity producing procedures are required, reliability of the structure is improved.

Figure 7:
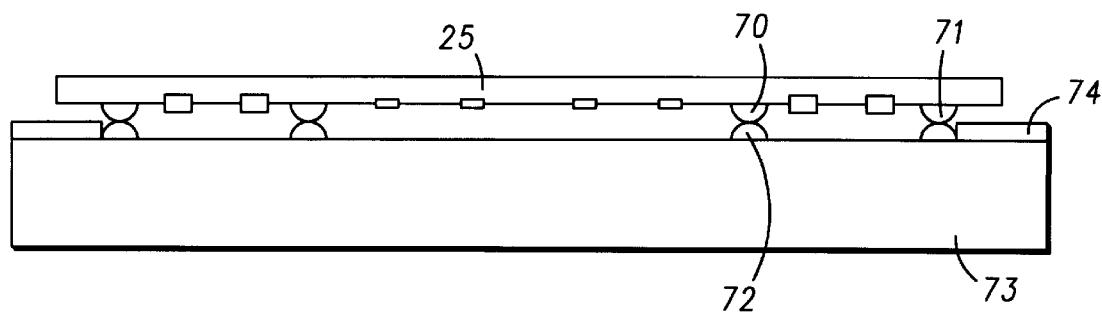
FIG. 7 is a simplified cross-sectional view illustrating the structure of FIG. 6 passivated.

A bump pad 70 is formed on the surface of the structure so as to encircle the array area on the semiconductor substrate. Bump pad 70 can be formed of any convenient sealing material, such as an adhesive, solder, etc. Since no electrical connections are made by bump pad 70, it is not necessary that this pad be formed of electrically conductive material. Additionally, driver bump pads 71 are formed in electrical contact with driver circuits 11 and 12. Driver bump pads 71 are formed of solder or the like to ensure a good electrical connection to driver circuits 11 and 12. Turning to FIG. 7 for additional reference, a mating bump pad 72 is formed on a second substrate 73 and cable connectors 74 are formed to mate with driver bump pads 71. Second substrate 73 is formed of material which will form a good hermetic seal over the array area when properly sealed thereto, such as glass, some light transmissive plastics, etc., since OEDs 40 can be very susceptible to moisture and ambient conditions. The first and second bump pads 70 and 72 are bonded together to seal the array area and driver bump pads 71 are engaged with cable connectors 74 to provide external electrical connections to driver circuits 11 and 12.

Thus, a new and improved active OED array and driving apparatus have been disclosed with a high fill factor which is easier and less expensive to fabricate and use. The new and improved active OED array and driving apparatus includes an array of OEDs, active circuits and drivers integrated onto a single substrate and passivated to improve reliability.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. An active matrix organic light emitting device array comprising:

a semiconductor substrate having an array area defined thereon;

a plurality of field effect transistors, each including first and second current carrying terminals and a control terminal, formed in the array area on the semiconductor substrate in rows and columns, each of the rows including a row bus coupled to the first current carrying terminal of each field effect transistor in the row, and each of the columns including a column bus coupled to the control terminal of each field effect transistor in the column;

a planarizing layer of insulating material positioned over the plurality of field effect transistors in the array area and defining a substantially planar surface;

a plurality of contact pads formed on the planar surface of the planarizing layer in the array area in rows and columns, each contact pad of the plurality of contact pads associated with one field effect transistor of the plurality of field effect transistors and coupled to the second current carrying terminal of the associated field effect transistor by a conductor formed through the planar layer;

a plurality of layers of organic material sequentially formed in overlying relationship on the contact pads in the array area so as to define an organic light emitting device on each contact pad with each contact pad operating as a first terminal of an overlying organic light emitting device; and electrical and light conducting material positioned in overlying relationship over the layers of organic material in the array area and operating as a common second terminal of the organic light emitting devices.

2. An active matrix organic light emitting device array as claimed in claim 1 wherein the semiconductor substrate includes one of silicon, GaAs, SiC, and sapphire.

3. An active matrix organic light emitting device array as claimed in claim 1 wherein the plurality of field effect transistors includes MOSFETs.

4. An active matrix organic light emitting device array as claimed in claim 1 wherein each of the plurality of contact pads is coupled to the second current carrying terminal of the associated field effect transistor by a feedthrough connection through the planarizing layer of insulating material.

5. An active matrix organic light emitting device array as claimed in claim 1 wherein the plurality of layers of organic material includes an electron transporting layer, a light emitting layer and a hole transporting layer sequentially formed in overlying relationship.

6. An active matrix organic light emitting device array as claimed in claim 1 wherein the planarizing layer of insulating material includes $SiO_2$.

7. An active matrix organic light emitting device array as claimed in claim 1 wherein the plurality of contact pads include aluminum.

8. An active matrix organic light emitting device array as claimed in claim 7 wherein the first current carrying terminal of each of the field effect transistors is a drain, the second current carrying terminal of each of the field effect transistors is a source, and the control terminal of each of the field effect transistors is a gate.

9. An active matrix organic light emitting device array as claimed in claim 8 wherein the first terminal of each of the overlying organic light emitting devices is a cathode.

10. An active matrix organic light emitting device array as claimed in claim 9 wherein the common second terminal includes a thin layer of gold and a layer of indium-tin-oxide.

11. An active matrix organic light emitting device array as claimed in claim 8 wherein the first terminal of each of the overlying organic light emitting devices is an anode and includes a layer of indium-tin-oxide positioned between the aluminum contact pad and the plurality of layers of organic material.

12. An active matrix organic light emitting device array as claimed in claim 11 wherein the common second terminal includes a thin layer of one of magnesium and lithium-silver and a layer of indium-tin-oxide sequentially formed in overlying relationship.

13. An active matrix organic light emitting device array as claimed in claim 1 wherein the semiconductor substrate further has driver areas defined thereon with CMOS driver circuits formed on the substrate.

14. An active matrix organic light emitting device array as claimed in claim 13 wherein the CMOS driver circuits include row drivers coupled to the row buses and column drivers coupled to the column buses.

15. An active matrix organic light emitting device array as claimed in claim 14 including in addition a second substrate formed of light transmissive material bonded to the semiconductor substrate in overlying relationship so as to encapsulate the array area.

16. An active matrix organic light emitting device array as claimed in claim 15 wherein the second substrate includes externally accessible electrical connectors coupled to the CMOS driver circuits.

17. An active matrix organic light emitting device array as claimed in claim 16 wherein the externally accessible electrical connectors are bump bonded to the CMOS driver circuits, a first bump pad encircles the array area on the semiconductor substrate and a mating bump pad is formed on the second substrate with the first and second bump pads engaged to seal the array area.

18. An active matrix organic light emitting device array comprising:

a semiconductor substrate having an array area defined thereon, the array area defining rows and columns of pixels, the semiconductor substrate further having driver areas defined thereon and spaced from the array area with driver circuits formed on the semiconductor substrate in the driver areas, the driver circuits including row drivers coupled to row buses in the array area and column drivers coupled to column buses in the array area;

a plurality of active control circuits formed in the array area one each associated with each pixel in the array area and a plurality of organic light emitting devices formed in the array area so as to define an organic light emitting device in each pixel, each of the active control circuits positioned between the semiconductor substrate and one of the organic light emitting devices, the active control circuit associated with each pixel being coupled between the organic light emitting device associated with the respective pixal and a row and column bus adjacent each pixel; and a second substrate formed of light transmissive material and including externally accessible electrical connectors coupled to the driver circuits, the semiconductor substrate including a first bump pad encircling the array area and the second substrate including a mating second bump pad with the first and second bump pads engaged to seal the array area.

19. An active matrix organic light emitting device array as claimed in claim 18 wherein the externally accessible electrical connectors are bump bonded to the driver circuits.

20. An active matrix organic light emitting device array as claimed in claim 18 wherein the plurality of active control circuits each include a field effect transistor.

21. An active matrix organic light emitting device array as claimed in claim 18 wherein the driver circuits each include a CMOS circuit.

22. An active matrix organic light emitting device array as claimed in claim 18 wherein the plurality of organic light emitting devices include:

a planarizing layer of insulating material positioned over the plurality of active control circuits in the array area and defining a substantially planar surface;

a plurality of contact pads formed on the planar surface of the planarizing layer in the array area in rows and columns, one contact pad associated with each pixel and coupled between the active control circuit and the organic light emitting device associated with the pixel; and a plurality of layers of organic material sequentially formed in overlying relationship on the contact pads in the array area so as to define an organic light emitting device on each contact pad with each contact pad operating as a first terminal of an overlying organic light emitting device.

* * * * *